(12) United States Patent
Heid

(10) Patent No.: US 6,774,631 B2
(45) Date of Patent: Aug. 10, 2004

(54) MAGNETIC RESONANCE GRADIENT COIL WITH A HEAT INSULATOR DISPOSED BETWEEN THE ELECTRICAL CONDUCTOR AND THE CARRIER STRUCTURE

(75) Inventor: Oliver Heid, Gunzenhausen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 09/840,577

(22) Filed: Apr. 23, 2001

(65) Prior Publication Data

US 2001/0033168 A1 Oct. 25, 2001

(30) Foreign Application Priority Data

Apr. 25, 2000 (DE) .......................................... 100 20 264

(51) Int. Cl.[7] ................................................ G01V 3/00
(52) U.S. Cl. ...................................................... 324/318
(58) Field of Search ........................ 324/306, 307–309, 324/318–322

(56) References Cited

U.S. PATENT DOCUMENTS

| | | | |
|---|---|---|---|
| 4,578,962 A | | 4/1986 | Dustmann |
| 4,675,636 A | | 6/1987 | Kawaguchi |
| 4,954,781 A | * | 9/1990 | Hirata .......................... 324/318 |
| 5,084,676 A | * | 1/1992 | Saho et al. .................. 324/318 |
| 5,363,845 A | * | 11/1994 | Chowdhury et al. ......... 600/422 |
| 5,372,137 A | * | 12/1994 | Wong et al. ................. 600/422 |
| 5,386,191 A | * | 1/1995 | McCarten et al. ........... 324/318 |
| 5,412,363 A | | 5/1995 | Breneman et al. |
| 5,489,848 A | * | 2/1996 | Furukawa .................... 324/318 |
| 5,570,021 A | * | 10/1996 | Dachniwskyj et al. ...... 324/318 |
| 5,786,695 A | | 7/1998 | Amor et al. |
| 5,793,210 A | * | 8/1998 | Pla et al. ..................... 324/318 |
| 6,043,653 A | * | 3/2000 | Takamori et al. ............ 324/309 |
| 6,054,858 A | * | 4/2000 | Dumoulin et al. ........... 324/322 |
| 6,075,363 A | * | 6/2000 | Sellers et al. ............... 324/318 |
| 6,111,412 A | * | 8/2000 | Boemmel et al. ........... 324/318 |
| 6,208,141 B1 | * | 3/2001 | Amor et al. ................. 324/318 |
| 6,236,207 B1 | * | 5/2001 | Arz et al. .................... 324/318 |
| 6,239,680 B1 | * | 5/2001 | Nagano et al. ............. 335/296 |
| 6,404,200 B1 | * | 6/2002 | Dietz et al. ................. 324/318 |
| 6,414,489 B1 | * | 7/2002 | Dean et al. ................. 324/318 |
| 6,501,275 B1 | * | 12/2002 | Westphal .................... 324/319 |
| 6,525,537 B2 | * | 2/2003 | Nerreter ..................... 324/322 |
| 6,552,545 B2 | * | 4/2003 | Kaindl et al. ............... 324/318 |

FOREIGN PATENT DOCUMENTS

| | | |
|---|---|---|
| DE | 197 22 211 | 8/1998 |
| DE | 198 39 987 | 3/2000 |
| GB | 2 342 986 | 4/2000 |
| JP | 11176630 | 7/1999 |
| JP | 11262200 | 9/1999 |
| WO | WO 88/04057 | 6/1988 |
| WO | WO 95/12968 | 5/1995 |

* cited by examiner

Primary Examiner—Diego Gutierrez
Assistant Examiner—Dixomara Vargas
(74) Attorney, Agent, or Firm—Schiff Hardin LLP

(57) ABSTRACT

An electrical coil, particularly a gradient coil for a magnetic resonance apparatus, contains at least one electrical conductor, a carrier structure, at least one component of a cooling device and a heat insulator, which is arranged for at least one section of the conductor between the conductor and the carrier structure.

12 Claims, 2 Drawing Sheets

MAGNETIC RESONANCE GRADIENT COIL WITH A HEAT INSULATOR DISPOSED BETWEEN THE ELECTRICAL CONDUCTOR AND THE CARRIER STRUCTURE

BACKGROUND OF THE INVENTION

1. Field of the Invention

The present invention relates to an electrical coil, particularly a gradient coil for a magnetic resonance apparatus.

2. Description of the Prior Art

The technical range of application of electrical coils is versatile. In many designs, an electrical coil has a casting, for example from a artificial resin, in order to, among other things, obtain a high insulating strength and a high structural strength. Moreover, it is known to cool an electrical coil during operation of the coil in order to, among other things, increase the efficiency. For this purpose, a cooling device, for example, transports heat arising in a conductor of the coil as a result of a current flow out of the coil.

A highly stressed electrical coil is a gradient coil of a magnetic resonance apparatus, for example. Among other things, the magnetic resonance apparatus has a gradient coil system for generating rapidly switched gradient fields, as well as a basic field magnetic system for generating a static basic magnetic field. The gradient coil system often contains means for reducing non-homogeneity of the static basic magnetic field, referred to as shim devices. Given a passive shim device, a number of iron sheets are introduced into a suitable arrangement in the gradient coil system, for example. For this purpose, the basic magnetic field is measured before the iron sheets are inserted, and a calculating program determines the appropriate number and arrangement of the iron sheets.

The amplitudes of the required currents in the conductor of the coil are several hundred amperes during the operation of the gradient coil. The current increase rates and current decrease rates are several 100 kA/s. The driving voltage for the coil current is up to several kV. The gradient coil is frequently cooled for controlling the aforementioned high electrical performances. For example, German OS 197 21 985 and German OS 197 22 211 disclose a cooling device for indirectly cooling conductors of the gradient coil. A flexible cooling line, is interleaved with the conductors of the gradient coil system, in a cylindrical jacket which is the filled with resin. A cooling medium is fed through the cooling line for cooling the gradient coil.

For example, German OS 198 39 987 describes another embodiment for cooling a gradient coil. A conductor of the gradient coil is directly cooled by feeding a cooling medium through an inner cooling channel, which is surrounded by the conductor as a profile.

It is known from U.S. Pat. No. 5,786,695, for example, that a constant temperature of a passive shim device is important for a constant accuracy of a shim effect. The heat build-up in the conductor of the gradient coil leads to a change in temperature of the passive shim device, so that the homogeneity of the basic magnetic field and therefore the quality of magnetic resonance images is impaired. In order to prevent the aforementioned temperature fluctuations, the aforementioned patent teaches arranging the shim device in the gradient coil system such that it can be cooled by a circuit coolant for obtaining a high temperature stability.

SUMMARY OF THE INVENTION

An object of the present invention is to provide an improved coolable electrical coil.

This object is achieved in accordance with the invention in an electrical coil, particularly a gradient coil for a magnetic resonance apparatus, having at least one electrical conductor, a carrier structure, at least one component of a cooling device and a heat insulator, which is arranged between the conductor and the carrier structure for at least one section of the conductor.

As a result, the conductor of the coil can be operated at high temperatures without the carrier structure, such as a resin casting, simultaneously assuming dangerously high temperatures, which advantageously leads to a reduced thermal expansion of the carrier structure and increases the time stability of the gradient fields and of the basic magnetic field, particularly with respect to a magnetic resonance device. Since the conductor can assume high temperatures relative to the carrier structure, a cooling medium flow of the cooling device can be operated with a high temperature drop, so that high power densities are possible within the coil.

In an embodiment, at least one section of the conductor is hollow-cylindrically fashioned for conducting a cooling medium. For example, the aforementioned German OS 198 39 987 describes an embodiment of the aforementioned conductor interior cooling. In particular, an embodiment of the conductor as a hollow cylindrical conductor also achieves efficient high-frequency properties, for example regarding the skin effect.

In another embodiment, the component of the cooling device is fashioned for cooling at least one section of the conductor. As a result of the efficient thermal conductivity of the conductor, for example when the conductor is composed of cooper or aluminum, the component of the cooling device is only sufficient for one section of the conductor in order to obtain an efficient cooling effect for a larger section of the conductor. Sections of the conductor, which are not provided with the component of the cooling device, exhibit heat insulation given the aforementioned cooling by sectors. As a result, temperatures and temperature fluctuations, which occur in heat-insulated conductor sections being comparably far away from the location of cooling and which are greater compared to the cooling location, do not have a disadvantageous effect on the surrounding carrier structure. On the basis of the aforementioned cooling, which is only fashioned in sections, a correspondingly simple cooling device can be fashioned.

For this purpose, the section to be cooled of the conductor, in an embodiment, extends in an edge region of a spatial expanse of the coil, for example, given a spatial expanse corresponding to a hollow cylinder, in a region of a front side of the hollow cylinder. As a result of simple accessibility and short runs, the cooling device can be particularly simply and economically fashioned. Furthermore, space is available for other components in a central area.

In a further embodiment, the heat insulator encloses the conductor. A heat insulation of the conductor from all sides is thus achieved.

In another embodiment, the heat insulator exhibits less thermal conductivity than the carrier structure, the thermal conductivity of the heat insulator, for example, is greater by one to three factors less than the thermal conductivity of the carrier structure. A carrier structure that is primarily fashioned from a resin casting has a thermal conductivity of greater than approximately 0.15 W/(K·m), for example. The heat insulator can be fibrous material and/or high-resistance foam material containing one or more of glass, ceramic, mineral materials and/or polymer materials, such a heat insulator exhibits heat conductivities of approximately 0.05 W/(K·m) and less.

In a further embodiment, the carrier structure includes an arrangement for reducing non-homogeneity of a magnetic field, such as the above-described passive shim devices. The same is true for this arrangement as described above for the carrier structure. A complicated separate cooling of this arrangement for obtaining a high temperature stability is not necessary.

DESCRIPTION OF THE PREFERRED EMBODIMENTS

Figure 1:
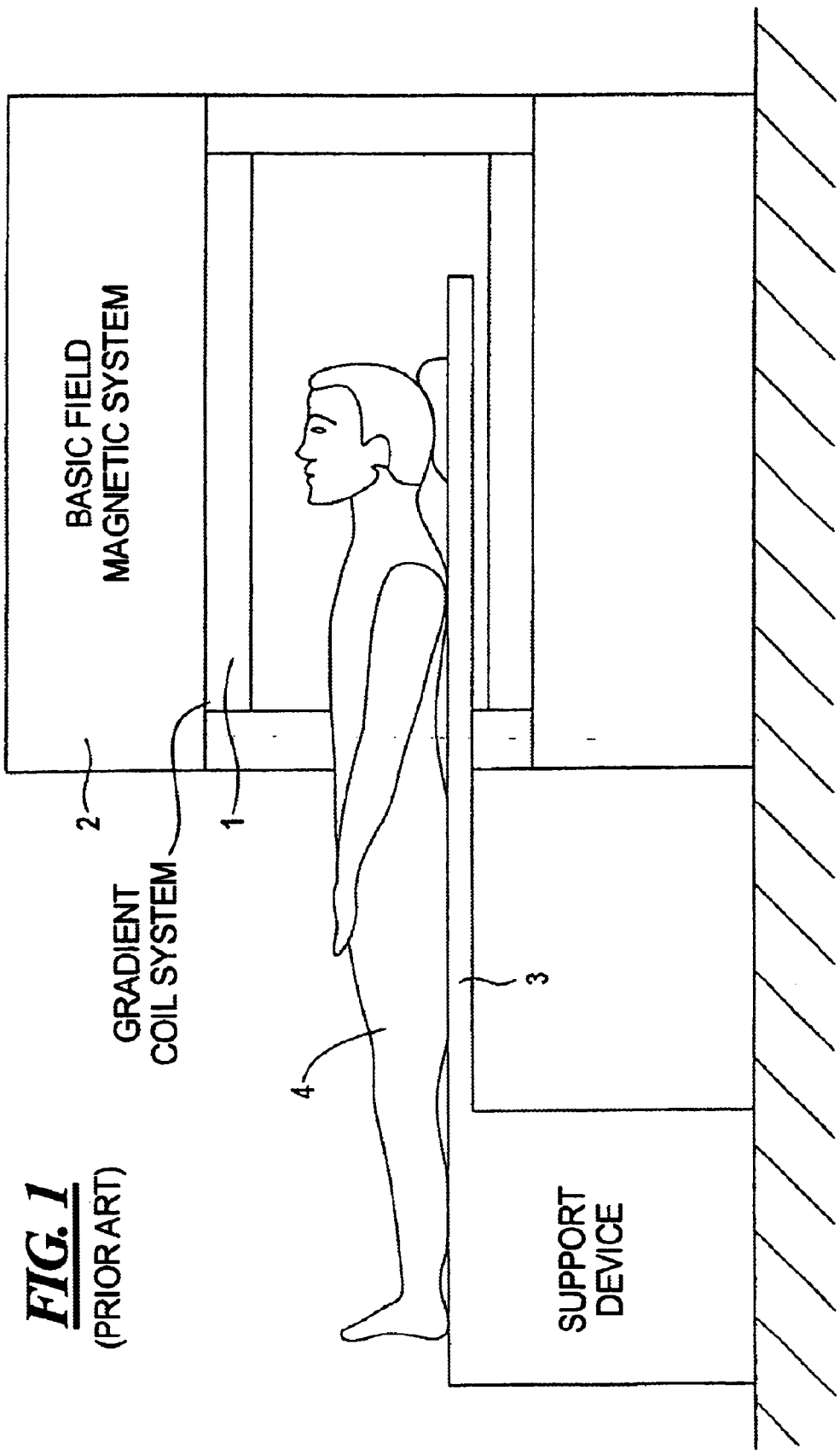
FIG. 1 is a side view of a magnetic resonance device having an inventive gradient coil system.

FIG. 1 shows a magnetic resonance device with a hollow cylindrical gradient coil system 1, containing at least one gradient coil. The gradient coil system 1 is fashioned for generating rapidly switchable magnetic gradient fields. Furthermore, the magnetic resonance device has a basic field magnetic system 2 for generating an optimally homogenous static basic magnetic field, as well as a support device 3, on which a patient 4, for example, is borne.

Figure 2:
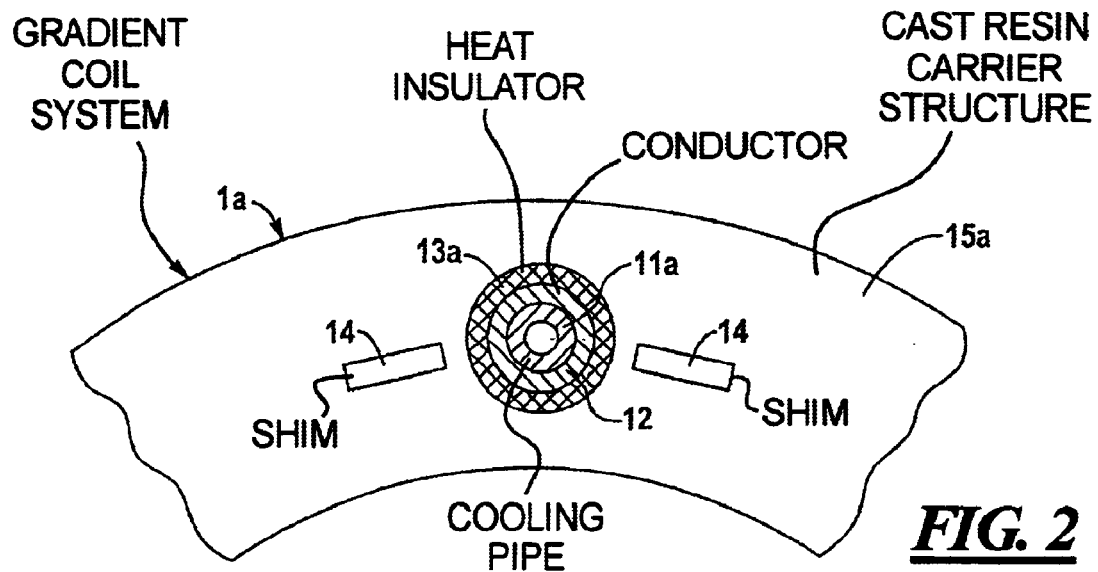
FIG. 2 is a longitudinal section through a first embodiment of the inventive coil system.

As an exemplary embodiment, FIG. 2 shows a longitudinal section through a first embodiment of a hollow cylindrical gradient coil system 1a.

A cross-section of an electrical conductor 12 of a gradient coil, as well as elements 14 for reducing non-homogeneity of the static basic magnetic field are shown enlarged. The electrical conductor 12, for example from copper or aluminum, is fashioned so as to be hollow cylindrical. A cooling pipe 11a, through which a cooling medium such as water can be guided for purposes of cooling the conductor 12, extends within the hollow cylindrical conductor 12 as a component of a cooling device. The cooling pipe 11a is fashioned from an electrically non-conducting material or only slightly conductive material, such as a flexible plastic.

A heat insulator 13a enclosing the conductor 12 is arranged between the electrical conductor 12 and a carrier structure 15a of the gradient coil system 1a, for example a cast resin. The heat insulator is fashioned of fibers and/or high-resistance foam and is composed of glass, ceramic, mineral materials and/or polymer materials, so that a thermal conductivity of the heat insulator 13a is less by a factor 3 than the thermal conductivity of the carrier structure 15a. Therefore, the conductor 12 can assume comparably high temperatures relative to the carrier structure 15a, and a cooling medium current can be operated with a high temperature drop in order to obtain high power densities. A structure-damaging alternating heating and cooling of the carrier structure 15a surrounding the electrical conductor 12 is thus prevented. Furthermore, a high temperature stability and therefore a high quality of magnetic resonance images is obtained for the means 14 for reducing non-homogeneity of the basic magnetic field, for example a passive shim device in a formation as iron sheets. In an embodiment, the electrical conductor 12 and the cooling pipe 11a are fashioned corresponding to the aforementioned German OS 198 39 987.

Figure 3:
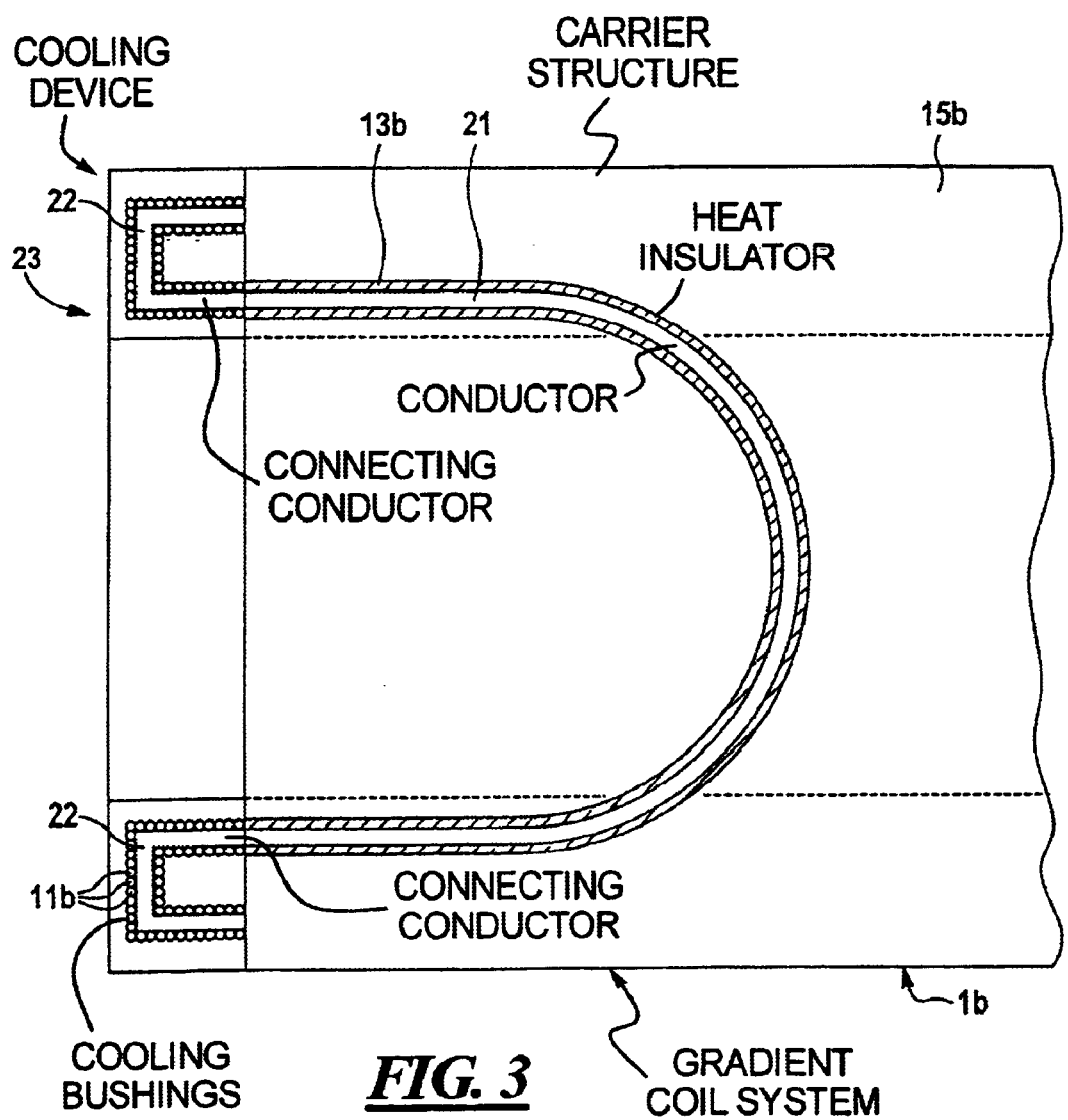
FIG. 3 is a side view of a second embodiment of the inventive gradient coil system.

As another exemplary embodiment of the invention, FIG. 3 shows a side view of a second embodiment of a hollow cylindrical gradient coil system 1b. Only a horseshoe-shaped conductor section 21 of a primary gradient coil is represented as an example for a cylinder jacket-shaped plane of the gradient coil system. This conductor section 21 is completely enclosed from a heat insulator 13b. At a front side of the hollow cylindrical gradient coil system 1b, the horseshoe-shaped conductor section 21 is connected to a further horseshoe-shaped conductor section (not shown) of a corresponding secondary coil by means of connecting conductors 22. Conductors of the secondary coil are also arranged in a cylinder jacket-shaped plane concentrically surrounding the cylinder jacket-shaped plane of the primary gradient coil. The connecting conductors 22 of the gradient coil at the front side can be cooled by being surrounded by cooling bushings 11b as components of a cooling device, with tight packing. A cooling medium can be guided through the cooling bushings 11b.

The aforementioned arrangement has the advantage that components 11b of the cooling device are arranged only at an easily accessible front side 23 and that the cooling device can be correspondingly simply and inexpensively fashioned. The inherent present high thermal conductivity of the horseshoe-shaped conductor section 21 is thereby utilized, so that an effective cooling of the horseshoe-shaped conductor section 21 can be simultaneously obtained given an intense cooling of the connecting conductors 22. The heat insulator 13b is fashioned as shown in FIG. 2. The heat insulator 13b has the effect that temperatures and temperature fluctuations, which particularly occur in a section of the conductor section 21 that is relatively far away from the connecting conductor 22 and which are greater than those in the connecting conductors 22 compared to the cooling location, do not have a disadvantageous effect on the surrounding carrier structure 15b.

Although modifications and changes may be suggested by those skilled in the art, it is the intention of the inventor to embody within the patent warranted hereon all changes and modifications as reasonably and properly come within the scope of his contribution to the art.

I claim as my invention:

1. An electrical coil suitable for use as a gradient coil for a magnetic resonance apparatus, comprising:

at least one electrical conductor configured in a coil pattern;

a carrier structure formed by a resin casting for said electrical conductor which fixes said coil pattern of said electrical conductor in a predetermined configuration; and a non-resinous heat insulator disposed between at least one section of said conductor and said carrier structure.

2. An electrical coil as claimed in claim 1 wherein at least a portion of said conductor is a hollow cylinder adapted for guiding a flowing cooling medium therein.

3. An electrical coil as claimed in claim 1 comprising a cooling device component and wherein said at least one section of said electrical conductor is a first section and wherein said cooling device component cools at least one second section of said electrical conductor.

4. An electrical coil as claimed in claim 3 wherein said at least one second section of said electrical conductor proceeds in an edge region of a spatial extent of said coil.

5. An electrical coil as claimed in claim 3 wherein said coil has a spatial extent forming a hollow cylinder, and wherein said at least one second section of said electrical conductor proceeds in a region of a front side of said hollow cylinder.

6. An electrical coil as claimed in claim 1 wherein said heat insulator surrounds said electrical conductor.

7. An electrical coil as claimed in claim 1 wherein said heat insulator has a fewer thermal conductivity than said carrier structure.

8. An electrical coil as claimed in claim 7 wherein said thermal conductivity of said heat insulator is lower by a factor between 1 and 3 than the thermal conductivity of the carrier structure.

9. An electrical coil as claimed in claim 1 wherein said carrier structure includes elements for reducing a non-homogeneity of a magnetic field in which said carrier structure and said electrical conductor are disposed.

10. An electrical call as claimed in claim 1 wherein said heat insulator comprises fibrous material.

11. An electrical coil as claimed in claim 1 wherein said heat insulator comprises high-resistance foam material.

12. An electrical coil as claimed in claim 1 wherein said heat insulator is composed of material selected from the group consisting of glass, ceramic, mineral materials and polymer materials.

* * * * *